(12) United States Patent  
Chu

(10) Patent No.: US 6,551,520 B1
(45) Date of Patent: Apr. 22, 2003

(54) EXHAUSTING METHOD AND MEANS IN A DRY ETCHING APPARATUS

(75) Inventor: Ron-Fu Chu, Taipei (TW)

(73) Assignee: Nanya Technology Corp. (TW)

( * ) Notice: Subject to any disclaimer, the term of this patent is extended or adjusted under 35 U.S.C. 154(b) by 135 days.

(21) Appl. No.: 09/589,080

(22) Filed: Jun. 8, 2000

(30) Foreign Application Priority Data

Feb. 21, 2000 (TW) ........................................ 89102919 A

(51) Int. Cl.$^7$ ................................................. C23F 1/00
(52) U.S. Cl. ............................ 216/67; 216/58; 216/63; 134/1; 134/1.1; 134/1.2; 134/1.3; 156/345; 279/128
(58) Field of Search ......................... 279/128; 156/345; 216/58, 63, 67; 438/706, 710, 729, 733; 134/1, 1.1, 1.2, 1.3

(56) References Cited

U.S. PATENT DOCUMENTS

| 4,384,918 | A | * | 5/1983 | Abe ............................ 156/345 |
| 5,264,040 | A | * | 11/1993 | Geyling ....................... 118/715 |
| 5,302,209 | A | * | 4/1994 | Maeda et al. ................ 118/719 |
| 5,306,379 | A | * | 4/1994 | Kamide ........................ 156/345 |
| 5,348,587 | A | * | 9/1994 | Eichman et al. ......... 118/723 E |
| 5,350,479 | A | * | 9/1994 | Collins et al. ............... 156/345 |
| 5,534,073 | A | * | 7/1996 | Kinoshita et al. ........... 118/725 |
| 5,673,167 | A | * | 9/1997 | Davenport et al. .......... 269/903 |
| 5,707,485 | A | * | 1/1998 | Rolfson et al. ............. 156/345 |
| 5,793,474 | A | * | 8/1998 | Nishi ............................. 355/53 |
| 5,812,362 | A | * | 9/1998 | Ravi ............................ 279/128 |
| 5,856,906 | A | * | 1/1999 | Kholodenko et al. ........ 279/128 |
| 5,882,489 | A | * | 3/1999 | Bersin et al. ........... 204/192.32 |
| 5,886,863 | A | * | 3/1999 | Nagasaki et al. ........... 279/128 |
| 5,904,800 | A | * | 5/1999 | Mautz ..................... 118/723 E |
| 5,964,954 | A | * | 10/1999 | Matsukawa et al. .......... 134/18 |
| 5,968,275 | A | * | 10/1999 | Lee et al. .................... 118/504 |
| 6,059,893 | A | * | 5/2000 | Kawasaki ...................... 134/21 |
| 6,073,576 | A | * | 6/2000 | Moslehi et al. ............... 118/52 |
| 6,120,610 | A | * | 9/2000 | Leibovich et al. .......... 118/728 |
| 6,168,660 | B1 | * | 1/2001 | Hayes et al. ................. 118/319 |
| 6,243,251 | B1 | * | 6/2001 | Kanno et al. ............... 279/128 |
| 6,296,780 | B1 | * | 10/2001 | Yan et al. ...................... 216/67 |

* cited by examiner

Primary Examiner—Randy Gulakowski
Assistant Examiner—Jiri Smetana
(74) Attorney, Agent, or Firm—Lowe Hauptman Gilman & Berner, LLP

(57) ABSTRACT

In a method for exhausting processing gases out of a dry etching apparatus, processing gases are introduced into a processing chamber of the dry etching apparatus and converted into a gas plasma to etch a semiconductor workpiece. After plasma etching the semiconductor workpiece, the gas plasma is centrally gathered under the semiconductor workpiece by a sucking force formed surrounding the bottom periphery of the semiconductor workpiece, and then, is exhausted. The semiconductor workpiece to be processed is placed on a chuck under which an exhausting means is arranged.

4 Claims, 3 Drawing Sheets

EXHAUSTING METHOD AND MEANS IN A DRY ETCHING APPARATUS

BACKGROUND OF THE INVENTION

1. Field of the Invention

This invention relates to a method and means for exhausting processing gases inside a dry etching apparatus, and more particularly, to a dry etching apparatus having a wafer chuck equipped with an exhausting means.

2. Description of the Prior Art

Vertical dry etching techniques are widely used in defining a semiconductor device of sub-micron features. Most of the dry etching techniques for semiconductor integrated circuit devices use processing gases introduced into a vacuum processing chamber at a low pressure. A high-frequency power is applied to convert the processing gases into a gas plasma. A workpiece such as a semiconductor wafer to be processed is affixed to a wafer chuck, being subject to an etching process. The gas plasma is then exhausted by an exhaust means located at lower side portions of the vacuum processing chamber.

In the etching process, non-uniform etching would produce an adverse effect on the wafers. This non-uniform etching phenomenon is influenced by various factors such as high frequency electric field, flow of the processing gases and the concentration of etching gas in the processing chamber. In the case of plasma etching, since the processing is carried out by utilizing a chemical reaction, dust particles, for example, reaction product, are produced during the processing, and such dust particles are deposited on the semiconductor wafer and the inner wall of the processing chamber in the plasma processing apparatus. It is known in the art that this causes various problems, and that the use of an electrostatic chuck can reduce the particle contamination problem. Examples of typical electrostatic chuck are Abe U.S. Pat. No. 4,384,918 and Collins et al. U.S. Pat. No. 5,350,479, both of which are incorporated herein for reference. Still, it is inevitable that small particles are formed. The particles cause yield problems and required frequent cleaning of the processing chamber.

SUMMARY OF THE INVENTION

It is, therefore, an object of this invention to provide a new method and means for exhausting the processing gases from the processing chamber in a dry etching apparatus.

It is another object of this invention to provide a method and means for applying an uniform gas plasma to the wafer to be processed on the wafer chuck.

It is yet another object of this invention to provide a method for reducing particles of the etching gas that remains on the semiconductor workpiece in a dry etching apparatus.

It is a further object of this invention to provide a method for avoiding frequent cleaning of the vacuum processing chamber in a dry etching apparatus.

According to this invention, a new method for exhausting processing gases from a dry etching apparatus, comprising the steps of: introducing the processing gases into the processing chamber, plasma etching the semiconductor workpiece to be processed, centrally gathering gas plasma into the space below the semiconductor workpiece by sucking force formed around the bottom periphery of the semiconductor device, and exhausting the gas from the dry etching apparatus.

BRIEF DESCRIPTION OF THE DRAWINGS

The accompanying drawings, which are incorporated in and constitute a part of the specification, illustrate a preferred embodiment of this invention and serve to explain the principles of this invention.

DESCRIPTION OF THE PREFERRED EMBODIMENTS

Figure 1:
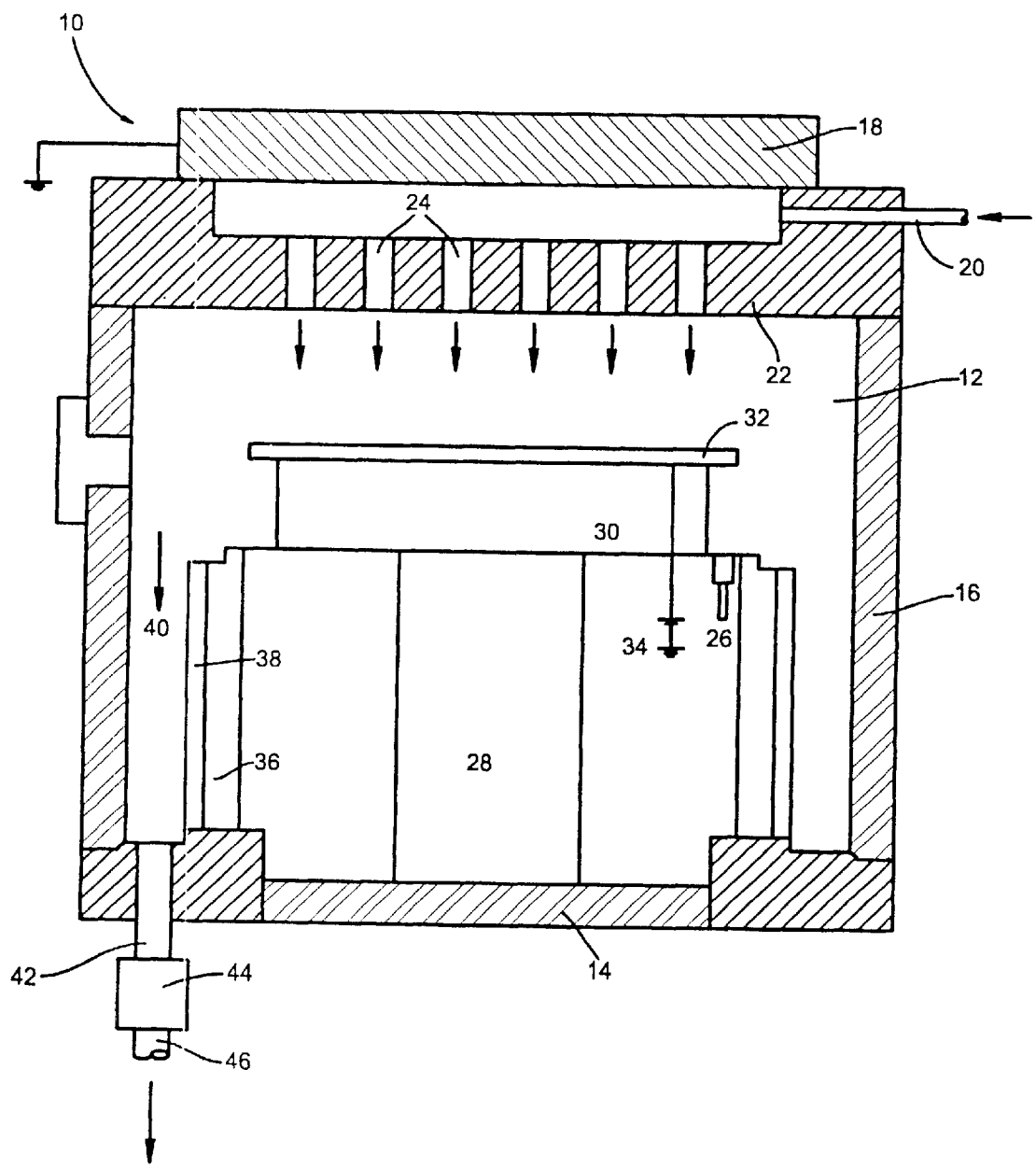
FIG. 1 is a schematic view of a known dry etching apparatus.
Figure 2:
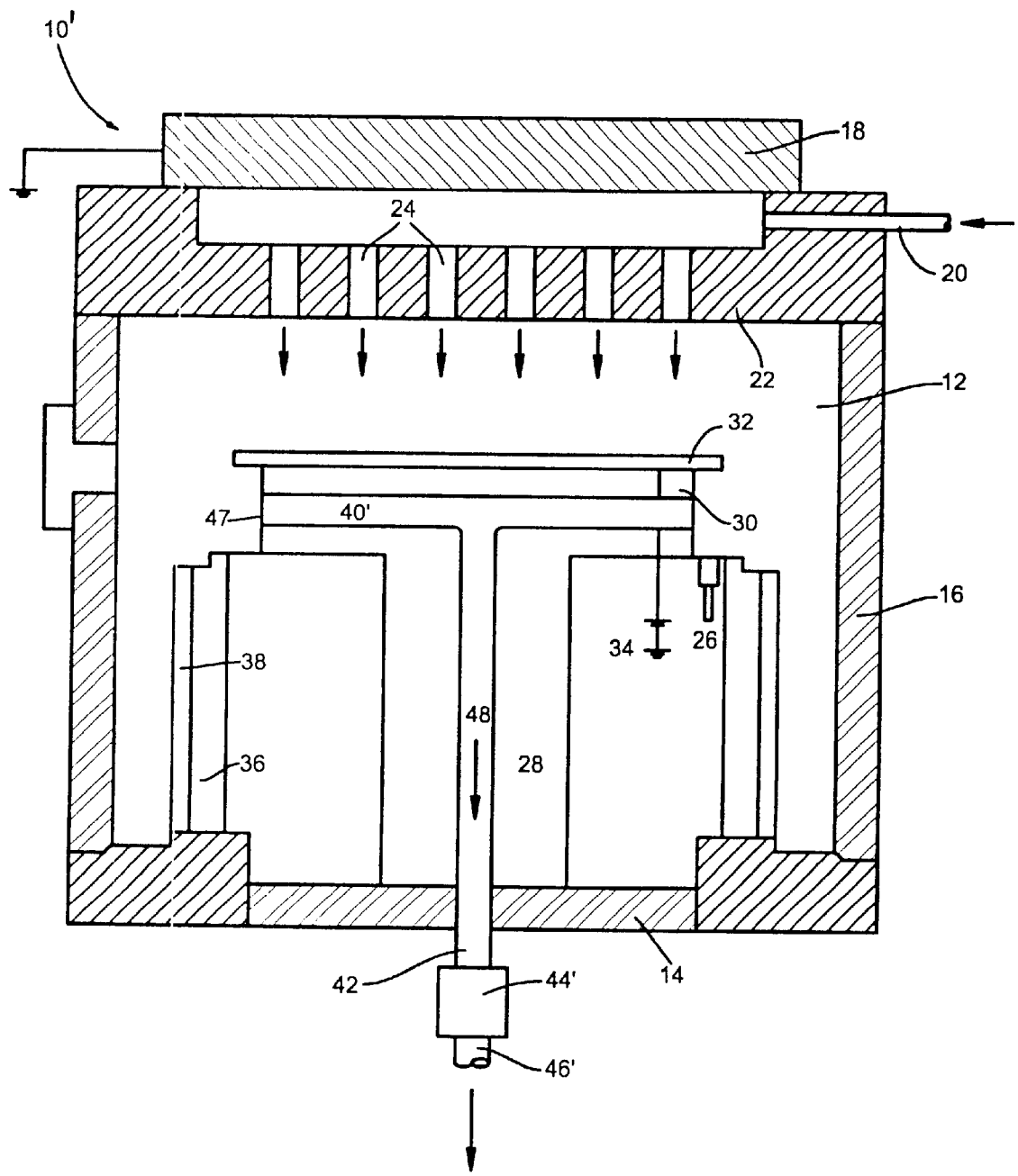
FIG. 2 is a schematic view of a preferred embodiment of this invention.
Figure 3:
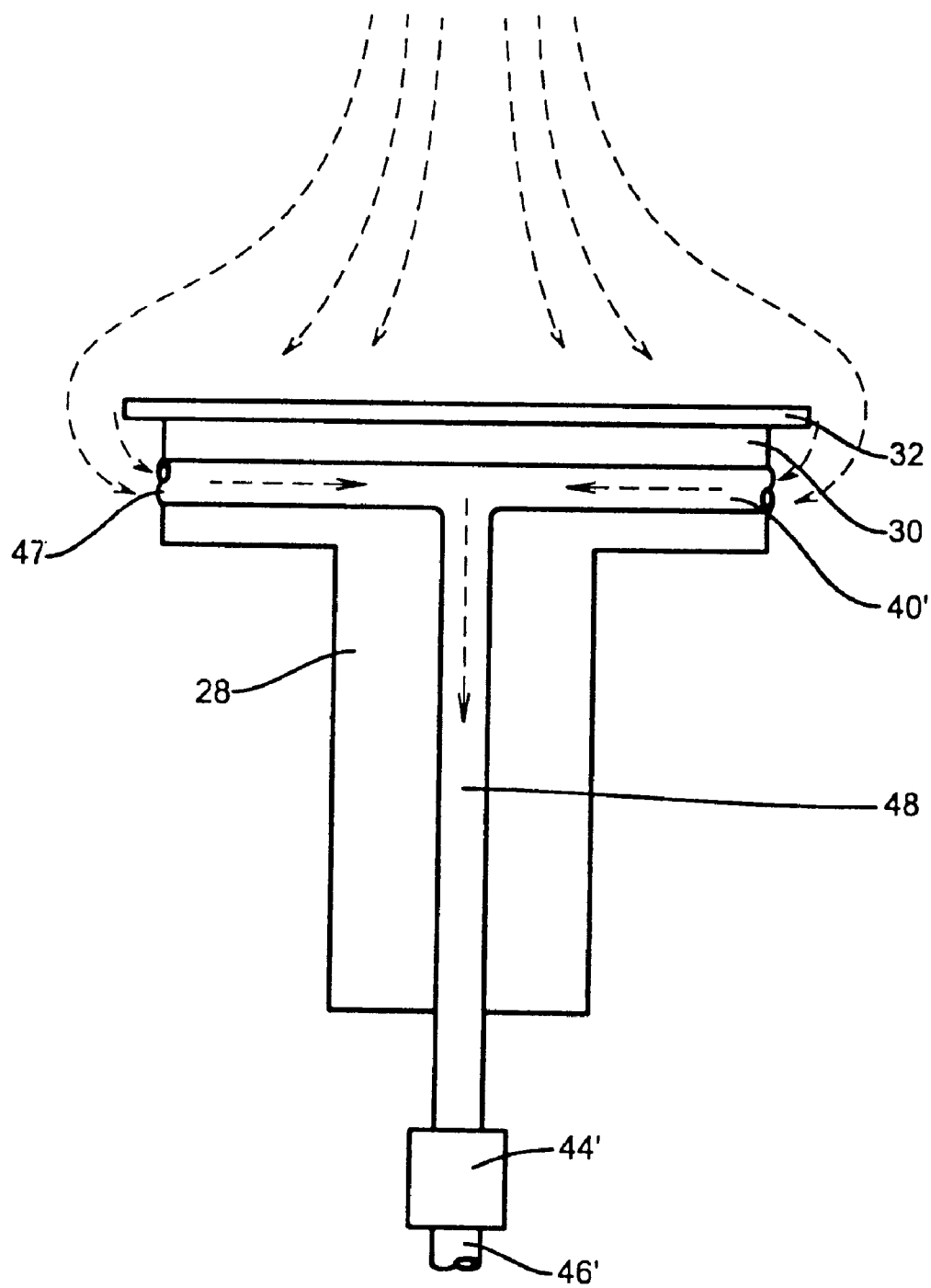
FIG. 3 is an enlarged schematic view of the flow of gas plasma in the dry etching apparatus of this invention.

Referring now to FIG. 1 of the drawing, there is depicted a dry etching apparatus 10 commonly used in the semiconductor manufacturing industry. The dry etching apparatus 10 includes a vacuum processing chamber 12 having a base plate 14, a cylindrical sidewall 16 and a top lid 18. A processing or reactive gas inlet 20 having a manifold 22 with a plurality of apertures 24, centrally disposed with respect to the cylindrical sidewall 16 and extending laterally about 15 cm, is disposed between the base plate 14 and the top lid 18 of the chamber 12. The chamber base plate 14, the sidewall 16, the top lid 18 and the manifold 22 are preferably made of aluminum and are connected to electrical ground. A cathode 26 is disposed on but insulated from the base plate 14, and a pedestal 28 located on the cathode 26 supports an electrostatic chuck 30 which in turn supports a semiconductor wafer 32.

A positive voltage from a power source 34 is applied to the copper layer of the electrostatic chuck 30. A cylindrical quartz wall 36 surrounds the cathode 26. An external cover 38 surrounding the quartz wall 36 defines a passageway 40 with the cylindrical sidewall 16 of the chamber 12 through which the processing gases flow from the gas inlet 20 to pump port 42 located on the lower side of the chamber 12. A pump 44 discharges the processing gas from the pump port 42 to a processing gas output 46. It is noted that the processing gas is discharged in a single direction in the dry etching apparatus 10. Therefore, the processing gas reacting on the periphery of the bottom surface of the semiconductor wafer 32 is non-uniform. a dry etching apparatus 10' with a passageway 40' located under the wafer chuck 30 so that the processing gas can uniformly apply to the semiconductor wafer 32. The passageway 40' surrounds the bottom of the wafer chuck 30 to suck in the processing gas from the periphery of the semiconductor wafer 32 on the wafer chuck 30. After the semiconductor wafer 32 is processed by the processing gas, the gas flows from the passageway 40' to a longitudinal discharge tube 48 within the pedestal 28 at the center of the chamber 12. The gas then is exhausted from a gas outlet 46' to the outside of the chamber 12 by an exhaust pump 44'.

According to one preferred embodiment of this invention, the passageway 40' is formed of the same material as the discharge tube 48. During plasma etching, a gas plasma is introduced from the apertures 24 of the manifold 22 of the gas inlet 20 to the semiconductor 32 to be processed on the wafer chuck 30. It is preferred that the passageway 40' is located right under the wafer chuck 30. Hence, the exhausting means of this invention produces a centripetal force which causes the processing gas spraying from the apertures 24 to be more uniformly applied to the surface of the semiconductor wafer 32 to be processed, as compared with the conventional dry etching apparatus. Further, since the centripetal force results in a sucking force, the reaction product and the other residual gas generated after processing the semiconductor wafer 32 flow into the passageway 40' and move toward the discharge tube 48, and finally, are exhausted through the gas outlet 46' by the exhaust pump 44'.

With this construction, the inventor finds that less residual remain on the surface of the semiconductor wafer 32. Significantly, the frequency of cleaning the processing chamber 12 is reduced, and also, the yield of the semiconductor products is improved.

Additional advantages and modifications will readily occur to those skilled in the art. Therefore, the invention in its broader aspect is not limited to the specific details, and illustrated example shown and described herein. Accordingly, various modifications may be made without departing from the spirit or scope of the general inventive concept as defined by the appended claims and their equivalents.

What is claimed is:

1. A method for exhausting gases in a dry etching apparatus, characterized in that gas plasma in a vacuum processing chamber of said dry etching apparatus is uniformly applied to the surface of a semiconductor workpiece to be processed by a centripetal sucking force surrounding the bottom periphery of said semiconductor workpiece and that said gas plasma is centrally gathered into a single centrally located discharge tube disposed under said semiconductor workpiece after flowing across the periphery of said semiconductor workpiece and is discharged through said discharge tube from said processing chamber, wherein said exhausting means is integrated with and located right under a chuck that supports said semiconductor workpiece.

2. The method of claim 1, wherein said centripetal sucking force is produced by reducing operating pressure.

3. The method of claim 1, wherein said centripetal sucking force is produced by an exhausting means.

4. The method of claim 3, wherein said exhausting means comprises at least one gas outlet and a pump means.

* * * * *